United States Patent [19]

Nakamura et al.

[11] Patent Number: 5,509,183

[45] Date of Patent: Apr. 23, 1996

[54] METHOD FOR MANUFACTURING A SUPERCONDUCTING DEVICE HAVING AN EXTREMELY THIN SUPERCONDUCTING CHANNEL FORMED OF OXIDE SUPERCONDUCTOR MATERIAL

[75] Inventors: Takao Nakamura; Hiroshi Inada; Michitomo Iiyama, all of Osaka, Japan

[73] Assignee: Sumitomo Electric Industries, Ltd., Osaka, Japan

[21] Appl. No.: 439,784

[22] Filed: May 12, 1995

Related U.S. Application Data

[62] Division of Ser. No. 989,787, Dec. 10, 1992, Pat. No. 5,447,907.

[30] Foreign Application Priority Data

| Dec. 10, 1991 | [JP] | Japan | 3-350186 |
| Dec. 12, 1991 | [JP] | Japan | 3-351669 |
| Dec. 8, 1992 | [JP] | Japan | 4-351723 |

[51] Int. Cl.$^6$ .................................. H01B 12/00
[52] U.S. Cl. .................. 29/25.01; 505/330; 505/701; 437/910
[58] Field of Search ............... 29/25.01, 25.02; 437/910, 62; 505/701, 922, 330

[56] References Cited

U.S. PATENT DOCUMENTS

| 5,126,315 | 6/1992 | Nishino et al. | 505/1 |
| 5,236,896 | 8/1993 | Nakamura et al. | 505/1 |
| 5,274,249 | 12/1993 | Xi et al. | 505/1 |
| 5,399,546 | 3/1995 | Nakamura et al. | 505/701 |
| 5,446,015 | 8/1995 | Nakamura et al. | 505/701 |

FOREIGN PATENT DOCUMENTS

| 0324044 | 7/1989 | European Pat. Off. |  |
| 6060786 | 4/1985 | Japan | 505/922 |
| 1-101676 | 4/1989 | Japan |  |
| 0282661 | 3/1990 | Japan | 437/910 |

OTHER PUBLICATIONS

Wu et al., "High Critical Current In Epitaxial $YBa_2Cu_3O_{7-x}$ Thin Films On Silicon With Buffer Layers", *Appl. Phys. Lett.*, vol. 54, No. 8, pp. 754–756, (1989).

Olsson et al., "Crack Formation In Epitaxial [110] Thin Films Of $YBa_2Cu_3O_{7-x}$ on $[110]SrTiO_3$ Substrates", *Appl. Phys. Lett.*, vol. 58, No. 15, pp. 1682–1684, (1991).

*Primary Examiner*—Tom Thomas
*Assistant Examiner*—Michael Trinh
*Attorney, Agent, or Firm*—Foley & Lardner

[57] ABSTRACT

A superconducting device comprising a substrate having a principal surface, a superconducting source region and a superconducting drain region formed of an oxide superconductor on the principal surface of the substrate separated from each other, an extremely thin superconducting channel formed of the oxide superconductor between the superconducting source region and the superconducting drain region. The superconducting channel electrically connects the superconducting source region to a superconducting drain region, so that a superconducting current can flow through the superconducting channel between the superconducting source region and the superconducting drain region. The superconducting device comprises a gate electrode through a gate insulator on the superconducting channel for controlling the superconducting current flowing through the superconducting channel, and non-superconducting oxide layers having a similar crystal structure to that of the oxide superconductor. The non-superconducting oxide layers contact with at least the superconducting source region and the superconducting drain region. In the superconducting device, the superconducting channel, the superconducting source region and the superconducting drain region are formed of one oxide superconductor thin film of which the center portion is c-axis oriented and the both ends are a-axis oriented.

21 Claims, 4 Drawing Sheets

5 SUBSTRATE

20 OXIDE LAYER

5 SUBSTRATE

11 OXIDE SUPERCONDUCTOR THIN FILM

20 OXIDE LAYER

5 SUBSTRATE

METHOD FOR MANUFACTURING A SUPERCONDUCTING DEVICE HAVING AN EXTREMELY THIN SUPERCONDUCTING CHANNEL FORMED OF OXIDE SUPERCONDUCTOR MATERIAL

This application is a division, of application Ser. No. 07/989,787, filed Dec. 10, 1992, U.S. Pat. No. 5,447,907.

BACKGROUND OF THE INVENTION

1. Field of the Invention

The present invention relates to a superconducting device and a method for manufacturing the same, and more specifically to a superconducting device having an extremely third superconducting channel formed of oxide superconductor material, and a method for manufacturing the same.

2. Description of Related Art

Devices which utilize superconducting phenomena operate rapidly with low power consumption so that they have higher performance than conventional semiconductor devices. Particularly, by using an oxide superconducting material which has been recently advanced in study, it is possible to produce a superconducting device which operates at relatively high temperature.

Josephson device is one of well-known superconducting devices. However, since Josephson device is a two-terminal device, a logic gate which utilizes Josephson devices becomes complicated. Therefore, three-terminal superconducting devices are more practical.

Typical three-terminal superconducting devices include two types of super-FET (field effect transistor). The first type of the super-FET includes a semiconductor channel, and a superconductor source electrode and a superconductor drain electrode which are formed closely to each other on both side of the semiconductor channel. A portion of the semiconductor layer between the superconductor source electrode and the superconductor drain electrode has a greatly recessed or undercut rear surface so as to have a reduced thickness. In addition, a gate electrode is formed through a gate insulating layer on the portion of the recessed or undercut rear surface of the semiconductor layer between the superconductor source electrode and the superconductor drain electrode.

A superconducting current flows through the semiconductor layer (channel) between the superconductor source electrode and the superconductor drain electrode due to a superconducting proximity effect, and is controlled by an applied gate voltage. This type of the super-FET operates at a higher speed with a low power consumption.

The second type of the super-FET includes a channel of a superconductor formed between a source electrode and a drain electrode, so that a current flowing through the superconducting channel is controlled by a voltage applied to a gate formed above the superconducting channel.

Both of the super-FETs mentioned above are voltage controlled devices which are capable of isolating output signal from input one and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about a few ten nanometers, if the superconductor source electrode and the superconductor drain electrode are formed of the oxide superconductor material. However, it is very difficult to conduct a fine processing such as a fine pattern etching, so as to satisfy the very short separation distance mentioned above.

On the other hand, the super-FET having the superconducting channel has a large current capability, and the fine processing which is required to product the first type of the super-FET is not needed to product this type of super-FET.

In order to obtain a complete ON/OFF operation, both of the superconducting channel and the gate insulating layer should have an extremely thin thickness. For example, the superconducting channel formed of an oxide superconductor material should have a thickness of less than five nanometers and the gate insulating layer should have a thickness more than ten nanometers which is sufficient to prevent a tunnel current.

In the super-FET, since the extremely thin superconducting channel is connected to the relatively thick superconducting source region and the superconducting drain region at their lower portions, the superconducting current flows substantially horizontally through the superconducting channel and substantially vertically in the superconducting source region and the superconducting drain region. Since the oxide superconductor has the largest critical current density $J_c$ in the direction perpendicular to c-axes of its crystal lattices, the superconducting channel is preferably formed of a c-axis oriented oxide superconductor thin film and the superconducting source region and the superconducting drain region are preferably formed of a-axis oriented oxide superconductor thin films.

In a prior art, in order to manufacture the super-FET which has the superconducting channel of c-axis oriented oxide superconductor thin film and the superconducting source region and the superconducting drain region of a-axis oriented oxide superconductor thin films, a c-axis oriented oxide superconductor thin film is formed at first and the c-axis oriented oxide superconductor thin film is etched and removed excluding a portion which will be the superconducting channel. Then, an a-axis oriented oxide superconductor thin film is deposited so as to form the superconducting source region and the superconducting drain region.

In another prior art, at first an a-axis oriented oxide superconductor thin film is deposited and etched so as to form the superconducting source region and the superconducting drain region, and then a c-axis oriented oxide superconductor thin film is deposited so as to form the superconducting channel.

However, in the prior art, the oxide superconductor thin film is degraded during the etching so that the superconducting characteristics is affected. In additions, the etched surface of the oxide superconductor thin film is roughened, therefore, if another oxide superconductor thin film is formed so as to contact the rough surface, an undesirable Josephson junction or resistance is generated at the interface.

By this, the super-FET manufactured by the above conventional process does not have an enough performance.

SUMMARY OF THE INVENTION

Accordingly, it is an object of the present invention to provide an FET type superconducting device having a superconducting region constituted of an extremely thin oxide superconductor film, which have overcome the above mentioned defects of the conventional ones.

Another object of the present invention is to provide a method for manufacturing an FET type superconducting device which have overcome the above mentioned defects of the conventional ones.

The above and other objects of the present invention are achieved in accordance with the present invention by a superconducting device comprising a substrate having a principal surface, a superconducting source region and a superconducting drain region formed of an oxide superconductor on the principal surface of the substrate separated from each other, an extremely thin superconducting channel formed of the oxide superconductor between the superconducting source region and the superconducting drain region, which electrically connects the superconducting source region to a superconducting drain region, so that a superconducting current can flow through the superconducting channel between the superconducting source region and the superconducting drain region, a gate electrode through a gate insulator on the superconducting channel for controlling the superconducting current flowing through the superconducting channel, and non-superconducting oxide layers having a similar crystal structure to that of the oxide superconductor, which contact with at least the superconducting source region and the superconducting drain region in which the superconducting channel, the superconducting source region and the superconducting drain region are formed of one oxide superconductor thin film of which the center portion is c-axis oriented and the both ends are a-axis oriented.

In the superconducting device in accordance with the present invention, the superconducting channel, the superconducting source region and the superconducting drain region are formed of one oxide superconductor thin film of which the center portion is c-axis oriented and the both ends are a-axis oriented and in which there is no grain boundary. Therefore, there is no undesirable resistance nor undesirable Josephson junction between the superconducting channel and the superconducting source region and between the superconducting channel and the superconducting drain region so that the current capability of the super-FET can be improved.

The superconducting device in accordance with the present invention may comprise two non-superconducting oxide layers having a similar crystal structure to that of the a-axis oriented oxide superconductor thin film, which contact with the outside surfaces of the superconducting source region and the superconducting drain region.

The superconducting device preferably includes a non-superconducting oxide layer having a similar crystal structure to that of the c-axis oriented oxide superconductor thin film under the superconducting channel, the superconducting source region and the superconducting drain region. Of course, the superconducting device may include two non-superconducting oxide layers having a similar crystal structure to that of the a-axis oriented oxide superconductor thin film on the both ends of the non-superconducting oxide layer, which contact with the outside surfaces of the superconducting source region and the superconducting drain region.

In one preferred embodiment, He non-superconducting oxide layer includes a hollow at he center portion on which the superconducting channel is positioned.

Preferably, the above non-superconducting oxide layers is formed of a $Pr_1Ba_2Cu_3O_{7-\epsilon}$ oxide. The c-axis oriented $Pr_1Ba_2Cu_3O_{7-\epsilon}$ thin film has an almost same crystal lattice structure as that of a c-axis oriented oxide superconductor thin film and the a-axis oriented $Pr_1Ba_2Cu_3O_{7-\epsilon}$ thin film has an almost same crystal lattice structure as that of an a-axis oriented oxide superconductor thin film.

In a preferred embodiment, the oxide superconductor is formed of high-$T_c$ (high critical temperature) oxide superconductor, particularly, formed of a high-$T_c$ copper-oxide type compound oxide superconductor for example a Y-Ba-Cu-O compound oxide superconductor material, a Bi-Sr-Ca-Cu-O compound oxide superconductor material, and a Tl-Ba-Ca-Cu-O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline operation. However, the superconducting device can be formed on a semiconductor substrate if an appropriate buffer layer is deposited thereon. For example, the buffer layer on the semiconductor substrate can be formed of a double-layer coating formed of a $MgAlO_4$ layer and a $BaTiO_3$ layer if silicon is used as a substrate.

Preferably, the superconducting channel is formed of a c-axis oriented oxide superconductor thin film and the superconducting source electrode and the superconducting drain electrode are formed of a-axis oriented oxide superconductor thin films.

According to another aspect of the present invention, there is provided a method of manufacturing a superconducting device, comprising the steps of forming on a principal surface of a substrate a non-superconducting oxide layer having a similar crystal structure to that of an a-axis oriented oxide superconductor thin film, selectively etching a center portion of the non-superconducting oxide layer so that the portion is completely removed and the surface of the substrate is exposed and the non-superconducting oxide layer is divided into two portions separated each other, forming an oxide superconductor thin film over the exposed surface of the substrate and the two separated portions of the non-superconducting oxide layer so that the portion of the oxide superconductor thin film on the exposed surface of the substrate become c-axis oriented and the portions of the oxide superconductor thin film on and near the separated portions of the non-superconducting oxide layer are a-axis oriented etching back the oxide superconductor thin film so that the portions of the oxide superconductor thin film on the separated portions of the non-superconducting oxide layer are completely removed and a superconducting channel a superconducting source region and a superconducting drain region having the same thickness as that of the separated portions of the non-superconducting oxide layer is formed between the separated portions of the non-superconducting oxide layer, and forming a gate insulator and a gate electrode stacked on the gate insulator on a center portion of the superconducting channel.

According to still another aspect of the present invention, there is provided a method of manufacturing a superconducting device, comprising the steps of forming on a principal surface of a substrate a first non-superconducting oxide layer having a similar crystal structure to that of a c-axis oriented oxide superconductor thin film, forming on the first non-superconducting oxide layer a second non-superconducting oxide layer having a similar crystal structure to that of an a-axis oriented oxide superconductor thin film, selectively etching a center portion of the second non-superconducting oxide layer so that the portion is completely removed and the surface of the first non-superconducting oxide layer is exposed and the second non-superconducting oxide layer is divided into two portions separated each other, forming an oxide superconductor thin film over the exposed surface of the first non-superconducting oxide layer and the two separated portions of the second non-superconducting oxide layer so that the portion of the oxide superconductor thin film on the exposed surface of the first non-superconducting oxide layer become c-axis oriented and the portions of the oxide superconductor thin film on and near the separated portions of the second non-superconducting oxide layer are a-axis oriented, etching back the oxide superconductor thin film so that the portions of the oxide superconductor thin film on the separated portions of the second non-superconducting oxide layer are completely removed and a superconducting channel, a superconducting source region and a superconducting drain region having the same thickness as that of the separated portions of the second non-superconducting oxide layer is formed between the separated portions of the second non-superconducting oxide layer, and forming a gate insulator and a gate electrode stacked on the gate insulator on a center portion of the superconducting channel.

According to another aspect of the present invention, there is provided a method of manufacturing a superconducting device, comprising the steps of forming on a principal surface of a substrate a non-superconducting oxide layer having a similar crystal structure to that of a c-axis oriented oxide superconductor thin film, forming an a-axis oriented oxide superconductor thin film on the non-superconducting oxide layer, selectively etching a center portion of the a-axis oriented oxide superconductor thin film and the non-superconducting oxide layer so that the portion of the a-axis oriented oxide superconductor thin film is completely removed and a hollow is formed at the portion, forming an oxide superconductor thin film over the a-axis oriented oxide superconductor thin film and the hollow portion of the non-superconducting oxide layer so that the portion of the oxide superconductor thin film on the hollow portion become c-axis oriented so as to constitute a superconducting channel and the portions of the oxide superconductor thin film on the a-axis oriented oxide superconductor thin film are a-axis oriented so as to constitute a superconducting source region and a superconducting drain region, and forming a gate insulator and a gate electrode stacked on the gate insulator on a center portion of the superconducting channel.

In the above methods, metal electrodes can be formed on the superconducting source region and the superconducting drain region, if necessary.

According to the method in accordance with the present invention, the superconducting channel the superconducting source electrode and the superconducting drain electrode are formed simultaneously of one oxide superconductor thin film which has a c-axis oriented portion and two a-axis oriented portions. Since the c-axis oriented portion and two a-axis oriented portions grows simultaneously, no grain boundary is formed at the interfaces so that the crystal structure is continuous. Therefore, no undesirable resistance and no undesirable Josephson junction is formed inside the oxide superconductor thin film.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 1A to 1F, the process in accordance with the present invention for manufacturing the super-FET will be described.

Figure 1A:
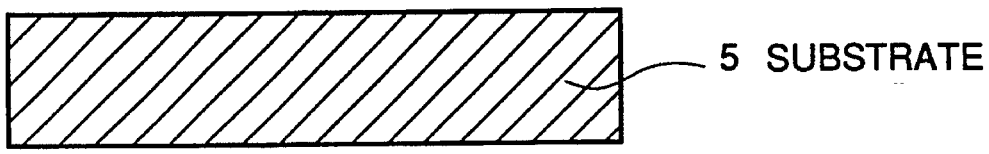
FIGS. 1A to 1F are diagrammatic sectional views for illustrating a first embodiment of the process in accordance with the present invention for manufacturing the super-FET.

As shown in FIG. 1A, a MgO (100) single crystalline substrate 5 having a substantially planar principal surface ((100) surface) is prepared.

Figure 1B:
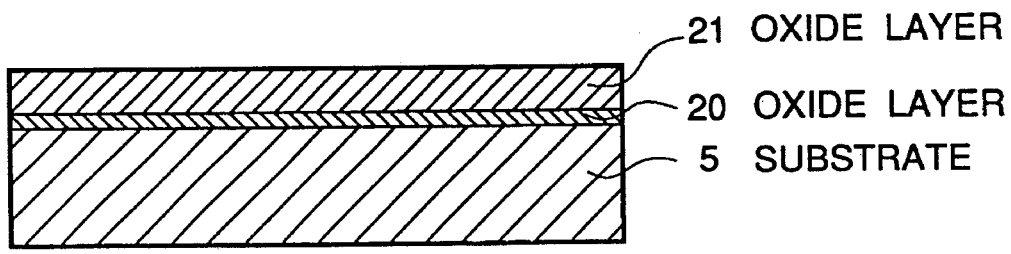

As shown in FIG. 1B, a c-axis oriented $Pr_1Ba_2Cu_3O_{7-\epsilon}$ oxide layer 20 having a thickness on the order of about 50 nanometers and an a-axis oriented $Pr_1Ba_2Cu_3O_{7-\epsilon}$ oxide layer 21 having a thickness on the order of about 300 nanometers are deposited and stacked on a principal surface of a MgO (100) single crystalline substrate 5 by for example a sputtering, an MBE (molecular beam epitaxy), a vacuum evaporation, a CVD, etc. A condition of forming the c-axis oriented $Pr_1Ba_2Cu_3O_7$ oxide layer 20 by off-axis sputtering is as follows:

| Temperature of the substrate | 750° C. |
|---|---|
| Sputtering Gas | Ar: 90% |
|  | $O_2$: 10% |
| Pressure | 10 Pa |

A condition of forming the a-axis oriented $Pr_1Ba_2Cu_3O_{7-\epsilon}$ oxide layer 21 by off-axis sputtering is as follows:

| Temperature of the substrate | 680° C. |
|---|---|
| Sputtering Gas | Ar: 90% |
|  | $O_2$: 10% |
| Pressure | 10 Pa |

Figure 1C:
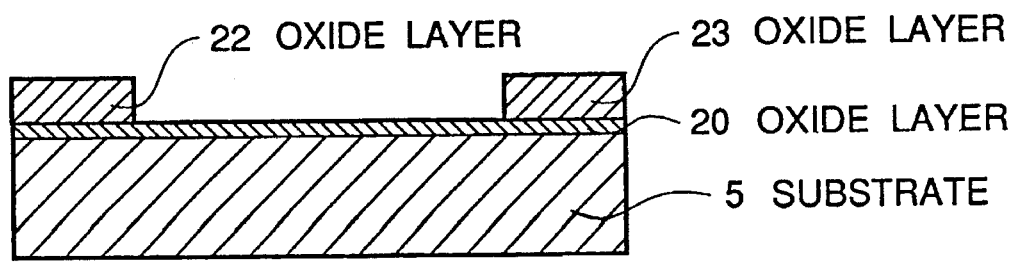

Then, a center portion of the $Pr_1Ba_2Cu_3O_{7-\epsilon}$ oxide layer 21 is selectively etched by a reactive ion etching process using a chloric gas, an ion milling using Ar-ions or a focused ion beam etching, so that the portion is completely removed and two oxide layers 22 and 23 are formed separately on the substrate 5, as shown in FIG. 1C. The c-axis oriented $Pr_1Ba_2Cu_3O_{7-\epsilon}$ oxide layer 20 is exposed at the center portion.

Thereafter, the substrate 5 is heated to a temperature of 350° to 400° C. under a pressure lower than $1\times10^{-9}$ Torr for 5 minutes so as to clean the exposed portion of the c-axis oriented $Pr_1Ba_2Cu_3O_{7-\epsilon}$ oxide layer 20.

Figure 1D:
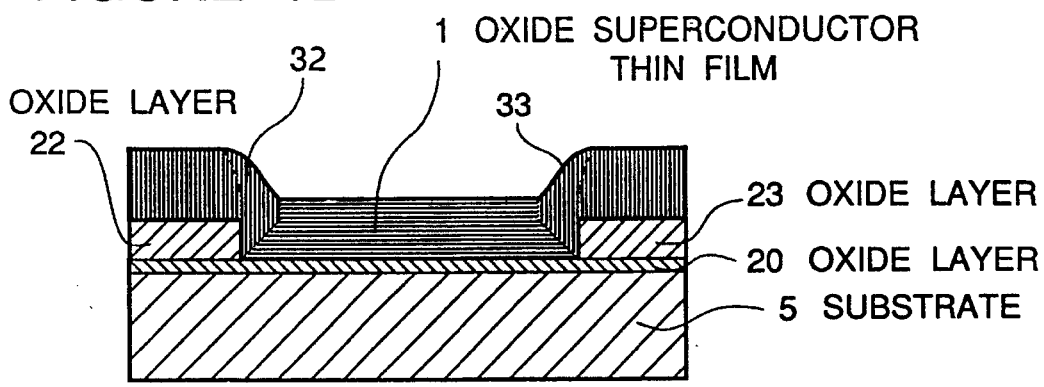

As shown in FIG. 1D, a $Y_1Ba_2Cu_3O_{7-\delta}$ oxide superconductor thin film 1 having a thickness of 300 nanometers is deposited over the c-axis oriented $Pr_1Ba_2Cu_3O_{7-\epsilon}$ oxide layer 20 and the oxide layers 22 and 23, by an off-axis sputtering. A condition of forming the $Y_1Ba_2Cu_3O_{7-67}$ oxide superconductor thin film 1 is established so that a c-axis oriented $Y_1Ba_2Cu_3O_{7-\delta}$ oxide superconductor thin film 1 grows on the MgO substrate 5. A condition of forming the $Y_1Ba_2Cu_3O_{7-\delta}$ oxide superconductor thin film 1 is by off-axis sputtering is as follows:

| | |
|---|---|
| Temperature of the substrate | 700° C. |
| Sputtering Gas | Ar: 90% |
| | O₂: 10% |
| Pressure | 10 Pa |

Portions 32 and 33 of the $Y_1Ba_2Cu_3O_{7-\delta}$ oxide superconductor thin film 1 on and near the a-axis oriented $Pr_1Ba_2Cu_3O_{7-\epsilon}$ oxide layers 22 and 23 become a-axis oriented, since the $Y_1Ba_2Cu_3O_{7-\delta}$ oxide superconductor thin film grows epitaxially to the a-axis oriented $Pr_1Ba_2Cu_3O_{7-\epsilon}$ oxide layers 22 and 23 at these portions. The rest portion of the $Y_1Ba_2Cu_3O_{7-\delta}$ oxide superconductor thin film 1 becomes c-axis oriented, since $Y_1Ba_2Cu_3O_{7-\delta}$ oxide superconductor thin film grows epitaxially to the c-axis oriented $Pr_1Ba_2Cu_3O_{7-\epsilon}$ oxide layer 20 at this portion. The $Y_1Ba_2Cu_3O_{7-\delta}$ oxide superconductor thin film 1 has a continuous crystal structure so that there is no grain boundary.

Figure 1E:
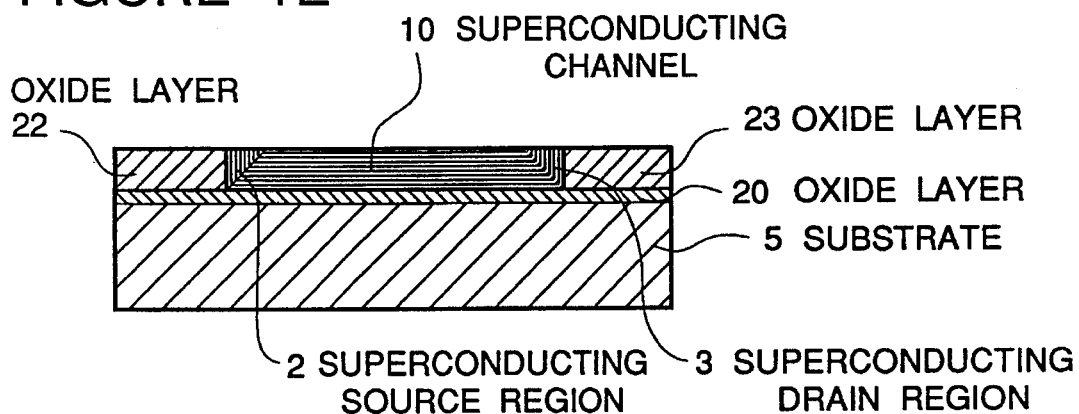

Then, the $Y_1Ba_2Cu_3O_{7-\delta}$ oxide superconductor thin film 1 is etched back by a reactive ion etching process using a chloric gas, an ion milling using Ar-ions or a focused ion beam etching, so that the portions of the $Y_1Ba_2Cu_3O_{7-\delta}$ oxide superconductor thin film 1 on the oxide layers 22 and 23 are removed and the center portion of the $Y_1Ba_2Cu_3O_{7-\delta}$ oxide superconductor thin film 1 become a superconducting channel 10 which has a determined thickness, as shown in FIG. 1E. A superconducting source region 2 and a superconducting drain region 3 are formed of continuous a-axis oriented $Y_1Ba_2Cu_3O_{7-\delta}$ oxide superconductor thin film portions at the both side of the superconducting channel 10.

Figure 1F:
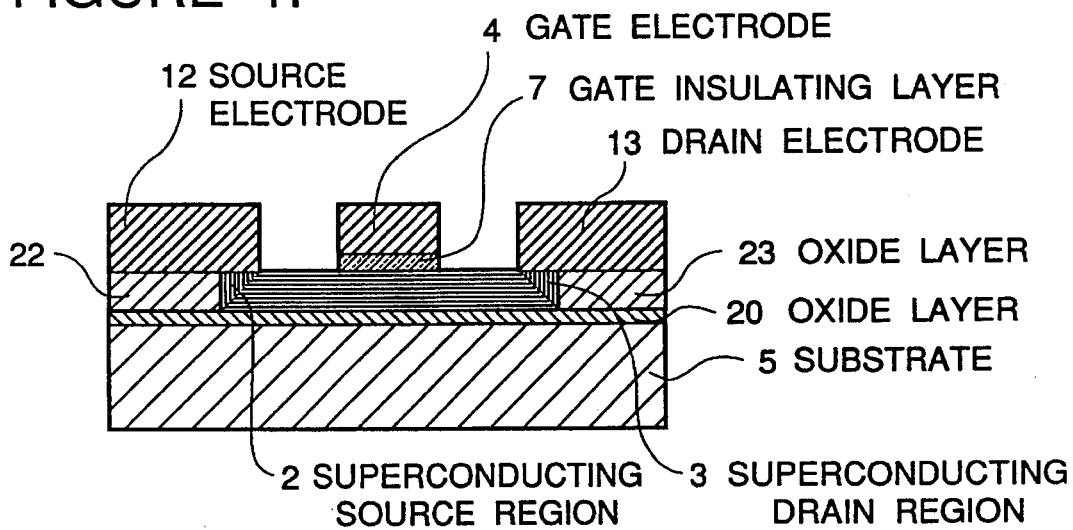

Finally, as shown in FIG. 1F, a gate insulating layer 7 and a gate electrode 4 are formed on the superconducting channel 10 and a source electrode 12 and a drain electrode 13 are formed on the superconducting source region 2 and a superconducting drain region 3. In this connection, portions of the $Y_1Ba_2Cu_3O_{7-\delta}$ oxide superconductor thin film 1 on the oxide layer 22 and 23 are removed when the gate electrode 4 is patterned. With this, the super-FET in accordance with the present invention is completed. The gate insulating layer 7 is preferably formed of MgO, silicon nitride or $SrTiO_3$ and the gate electrode 4 is preferably formed of a noble metal such as Au or Pt.

The above mentioned super-FET manufactured in accordance with the first embodiment of the method of the present invention has a superconducting channel, a superconducting source region and a superconducting drain region which are formed of a $Y_1Ba_2Cu_3O_{7-\delta}$ oxide superconductor thin film of which the center portion is c-axis oriented and the both ends are a-axis oriented. Therefore, there is no undesirable resistance nor undesirable Josephson junction between the superconducting channel and the superconducting source region and between the superconducting channel and the superconducting drain region. In addition, since the superconducting source region and the superconducting drain region have almost the same thickness as that of the superconducting channel, superconducting current efficiently flows into and flows from the superconducting channel. By this, the current capability of the super-FET can be improved.

Embodiment 2

Referring to FIGS. 2A to 2F, a second embodiment of the process for manufacturing the superconducting device will be described.

Figure 2A:
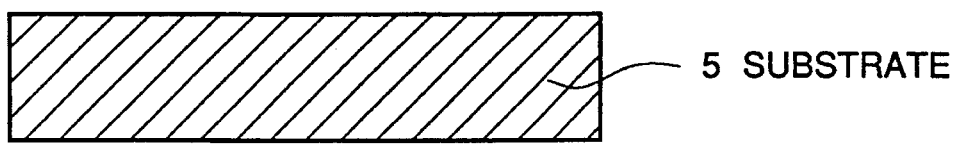
FIGS. 2A to 2F are diagrammatic sectional views for illustrating a second embodiment of the process in accordance with the present invention for manufacturing the super-FET.

As shown in FIG. 2A, an MgO (100) substrate 5 similar to that of Embodiment 1 was prepared.

Figure 2B:
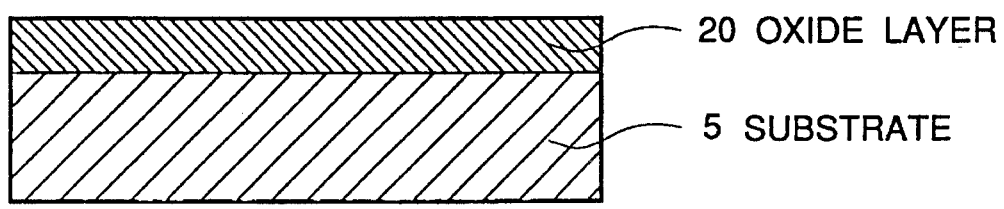

As shown in FIG. 2B, a c-axis oriented $Pr_1Ba_2Cu_3O_{7-\epsilon}$ oxide layer 20 having a thickness on the order of about 300 nanometers is deposited on a principal surface of a MgO (100) single crystalline substrate 5 by for example a sputtering, an MBE (molecular beam epitaxy), a vacuum evaporation, a CVD, etc. A condition of forming the c-axis oriented $Pr_1Ba_2Cu_3O_7$ oxide layer 20 by off-axis sputtering is as follows:

| | |
|---|---|
| Temperature of the substrate | 750° C. |
| Sputtering Gas | Ar: 90% |
| | O₂: 10% |
| Pressure | 10 Pa |

Figure 2C:
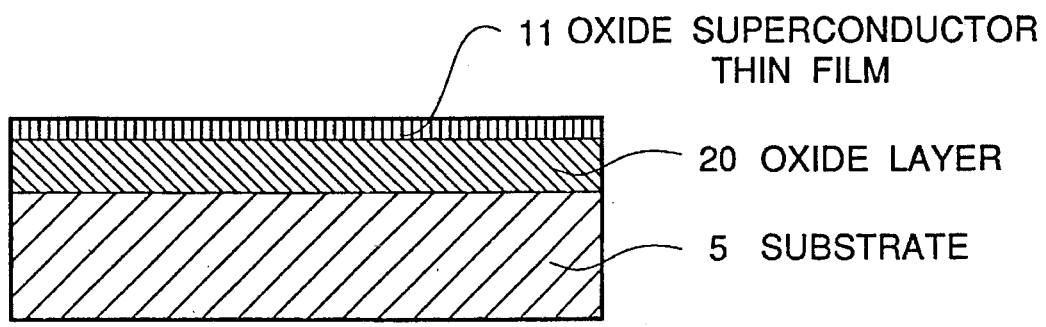

Then, as shown in FIG. 2C, an a-axis oriented $Y_1Ba_2Cu_3O_{7-\delta}$ oxide superconductor thin film 11 having a thickness of 100 nanometers is formed on the $Pr_1Ba_2Cu_3O_{7-\epsilon}$ oxide layer 20 by an off-axis sputtering. A condition of forming the $Y_1Ba_2Cu_3O_{7-\delta}$ oxide superconductor thin film 11 by off-axis sputtering is as follows:

| | |
|---|---|
| Temperature of the substrate | 640° C. |
| Sputtering Gas | Ar: 90% |
| | O₂: 10% |
| Pressure | 10 Pa |

It is preferable that the a-axis oriented $Y_1Ba_2Cu_3O_{7-\delta}$ oxide superconductor thin film 11 is formed successively after the $Pr_1Ba_2Cu_3O_{7-\epsilon}$ oxide layer 20 is formed and temperature of the substrate 5 is lowered.

Figure 2D:
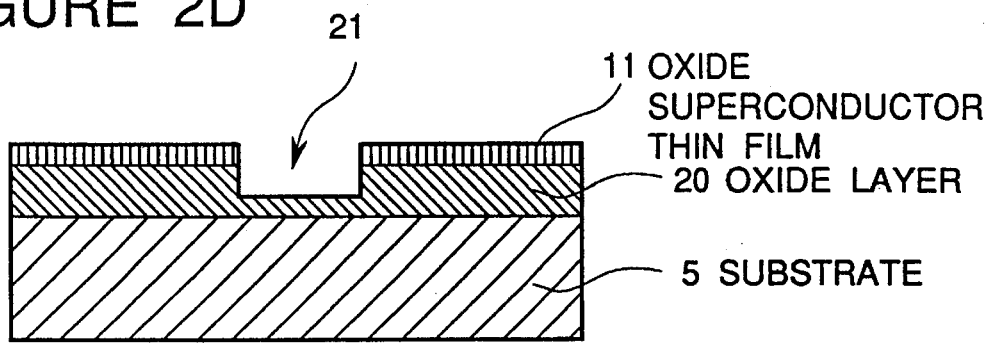

Thereafter, as shown in FIG. 2D, a portion of the a-axis oriented $Y_1Ba_2Cu_3O_{7-\delta}$ oxide superconductor thin film 11 at which a superconducting channel will be positioned is selectively etched by a reactive ion etching process using a chloric gas, an ion milling using Ar-ions or a focused ion beam etching, so that the portion is completely removed and the $Pr_1Ba_2Cu_3O_{7-\epsilon}$ oxide layer 20 is also etched so as to form a hollow 21 having a depth of 200 nanometers.

Figure 2E:
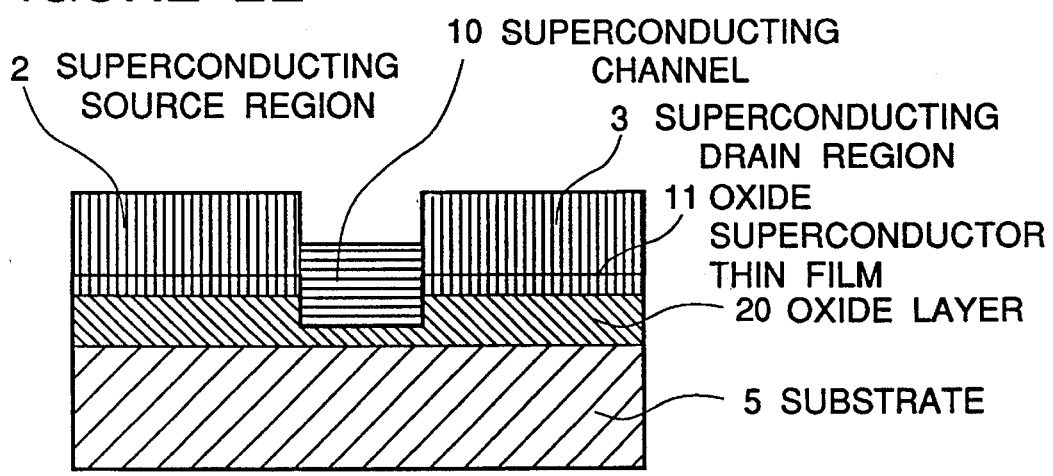

As shown in FIG. 2E, a $Y_1Ba_2Cu_3O_{7-\delta}$ oxide superconductor thin film having a thickness of 300 nanometers is deposited over the a-axis oriented $Y_1Ba_2Cu_3O_{7-\delta}$ oxide superconductor thin film 11 and the hollow portion 21 of $Pr_1Ba_2Cu_3O_{7-\epsilon}$ oxide layer 20. A condition of forming the $Y_1Ba_2Cu_3O_{7-\delta}$ oxide superconductor thin film is established so that a c-axis oriented $Y_1Ba_2Cu_3O_{7-\delta}$ oxide superconductor thin film grows on an ordinary substrate. A condition of forming the $Y_1Ba_2Cu_3O_{7-\delta}$ oxide superconductor thin film by off-axis sputtering is as follows:

| | |
|---|---|
| Temperature of the substrate | 700° C. |
| Sputtering Gas | Ar: 90% |
| | O₂: 10% |
| Pressure | 10 Pa |

Portions of the $Y_1Ba_2Cu_3O_{7-\delta}$ oxide superconductor thin film on the a-axis oriented $Y_1Ba_2Cu_3O_{7-\delta}$ oxide superconductor thin films 11 become a-axis oriented so as to constitute a superconducting source region 2 and a superconducting drain region 3, since the $Y_1Ba_2Cu_3O_{7-\delta}$ oxide superconductor thin film grows epitaxially to the a-axis oriented $Y_1Ba_2Cu_3O_{7-\delta}$ oxide superconductor thin films 11 at the portions. The rest portion of the $Y_1Ba_2Cu_3O_{7-\delta}$ oxide superconductor thin film becomes c-axis oriented so as to constitute a superconducting channel 10, since $Y_1Ba_2Cu_3O_{7-\delta}$ oxide superconductor thin film grows epitaxially to the c-axis oriented $Pr_1Ba_2Cu_3O_{7-\epsilon}$ oxide layer 20 at the portion. The $Y_1Ba_2Cu_3O_{7-\delta}$ oxide superconductor thin film has a continuous crystal structure so that there is no grain boundary.

Figure 2F:
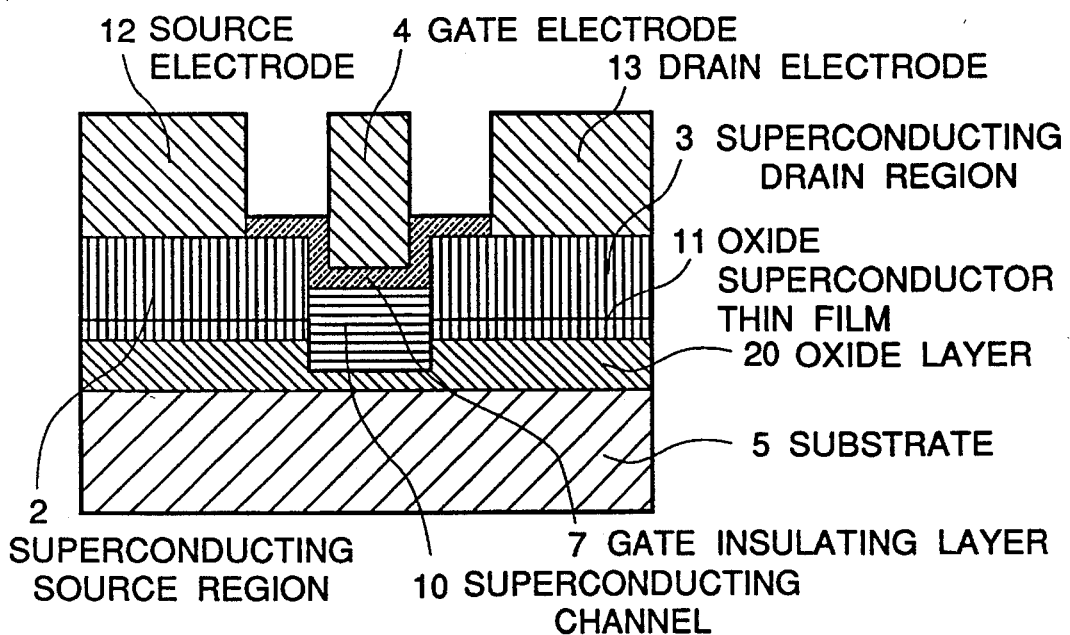

Finally, as shown in FIG. 2F, a gate insulating layer 7 of MgO, silicon nitride or $SrTiO_3$ and a gate electrode 4 are formed on the superconducting channel 10 and a source electrode 12 and a drain electrode 13 are formed on the superconducting source region 2 and a superconducting drain region 3. With this, the super-FET in accordance with the present invention is completed.

The above mentioned super-FET manufactured in accordance with the second embodiment of the method of the present invention has a superconducting channel, a superconducting source region and a superconducting drain region which are formed of a $Y_1Ba_2Cu_3O_{7-\delta}$ oxide superconductor thin film of which the center portion is c-axis oriented and the both ends are a-axis oriented. Therefore, there is no undesirable resistance nor undesirable Josephson junction between the superconducting channel and the superconducting source region and between the superconducting channel and the superconducting drain region.

In the above mentioned embodiments, the oxide superconductor thin film can be formed of not only the Y-Ba-Cu-O compound oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:
1. A method of manufacturing a superconducting device, comprising the steps of forming on a principal surface of a substrate a non-superconducting oxide layer having a similar crystal structure to that of an a-axis oriented oxide superconductor thin film, selectively etching a center portion of the non-superconducting oxide layer so that the portion is completely removed and the surface of the substrate is exposed and the non-superconducting oxide layer is divided into two portions separated each other, forming an oxide superconductor thin film over the exposed surface of the substrate and the two separated portions of the non-superconducting oxide layer so that the portion of the oxide superconductor thin film on the exposed surface of the substrate become c-axis oriented and the portions of the oxide superconductor thin film on and near the separated portions of the non-superconducting oxide layer are a-axis oriented etching back the oxide superconductor thin film so that the portions of the oxide superconductor thin film on the separated portions of the non-superconducting oxide layer are completely removed and a superconducting channel, a superconducting source region and a superconducting drain region having the same thickness as that of the separated portions of the non-superconducting oxide layer is formed between the separated portions of the non-superconducting oxide layer, and forming a gate insulator and a gate electrode stacked on the gate insulator on a center portion of the superconducting channel.

2. A method as claimed in claim 1, wherein the oxide superconductor is a high-$T_c$ oxide superconductor.

3. A method as claimed in claim 2, wherein the high-$T_c$ oxide superconductor is a high-$T_c$ copper oxide-type compound oxide superconductor.

4. A method as claimed in claim 1, wherein the non-superconducting oxide layer is formed of $Pr_1Ba_2Cu_3O_{7-\epsilon}$ thin film.

5. A method as claimed in claim 1, wherein the oxide superconductor is formed of oxide superconductor material selected from the group consisting of Y-BA-Cu-O compound oxide superconductor material, a Bi-Sr-Ca-Cu-O compound oxide superconductor material and a Tl-Ba-Ca-Cu-O compound oxide superconductor material.

6. A method as claimed in claim 1, wherein the substrate is formed of a material selected from the group consisting of MgO (100) substrate, a $SrTiO_3$ (100) substrate and a CdNdAlO$_4$ (001) substrate and a semiconductor substrate.

7. A method as claimed in claim 1, wherein the substrate is formed of a silicon substrate and a principal surface of the silicon substrate is coated with an insulating material layer which is formed of a $MgAlO_4$ layer and a $BaTiO_3$ layer.

8. A method of manufacturing a superconducting device, comprising the steps of forming on a principal surface of a substrate a first non-superconducting oxide layer having a similar crystal structure to that of a c-axis oriented oxide superconductor thin film, forming on the first non-superconducting oxide layer a second non-superconducting oxide layer having a similar crystal structure to that of an a-axis oriented oxide superconductor thin film, selectively etching a center portion of the second non-superconducting oxide layer so that the portion is completely removed and the surface of the first non-superconducting oxide layer is exposed and the second non-superconducting oxide layer is divided into two portions separated each other, forming an oxide superconductor thin film over the exposed surface of the first non-superconducting oxide layer and the two separated portions of the second non-superconducting oxide layer so that the portion of the oxide superconductor thin film on the exposed surface of the first non-superconducting oxide layer become c-axis oriented and the portions of the oxide superconductor thin film on and near the separated portions of the second non-superconducting oxide layer are a-axis oriented, etching back the oxide superconductor thin film so that the portions of the oxide superconductor thin film on the separated portions of the second non-superconducting oxide layer are completely removed and a superconducting channel, a superconducting source region and a superconducting drain region having the same thickness as that of the separated portions of the second non-superconducting oxide layer is formed between the separated portions of the second non-superconducting oxide layer, and forming a gate insulator and a gate electrode stacked on the gate insulator on a center portion of the superconducting channel.

9. A method as claimed in claim 8, wherein the oxide superconductor is a high-$T_c$ oxide superconductor.

10. A method as claimed in claim 9, wherein the high-$T_c$ oxide superconductor is a high-$T_c$ copper oxide-type compound oxide superconductor.

11. A method as claimed in claim 8, wherein the non-superconducting oxide layer is formed of $Pr_1Ba_2Cu_3O_{7-\epsilon}$ thin film.

12. A method as claimed in claim 8, wherein the oxide superconductor is formed of oxide superconductor material selected from the group consisting of Y-BA-Cu-O compound oxide superconductor material, a Bi-Sr-Ca-Cu-O compound oxide superconductor material and a Tl-Ba-Ca-Cu-O compound oxide superconductor material.

13. A method as claimed in claim 8, wherein the substrate is formed of a material selected from the group consisting of MgO (100) substrate, a $SrTiO_3$ (100) substrate and a CdNdAlO$_4$ (001) substrate and a semiconductor substrate.

14. A method as claimed in claim 8, wherein the substrate is formed of a silicon substrate and a principal surface of the silicon substrate is coated with an insulating material layer which is formed of a $MgAlO_4$ layer and a $BaTiO_3$ layer.

15. A method of manufacturing a superconducting device, comprising the steps of forming on a principal surface of a substrate a non-superconducting oxide layer having a similar crystal structure to that of a c-axis oriented oxide superconductor thin film, forming an a-axis oriented oxide superconductor thin film on the non-superconducting oxide layer, selectively etching a center portion of the a-axis oriented oxide superconductor thin film and the non-superconducting oxide layer so that the portion of the a-axis oriented oxide superconductor thin film is completely removed and a hollow is formed at the portion, forming an oxide superconductor thin film over the a-axis oriented oxide superconductor thin film and the hollow portion of the non-superconducting oxide layer so that the portion of the oxide superconductor thin film on the hollow portion become c-axis oriented so as to constitute a superconducting channel and the portions of the oxide superconductor thin film on the a-axis oriented oxide superconductor thin film are a-axis oriented so as to constitute a superconducting source region and a superconducting drain region, and forming a gate insulator and a-gate electrode stacked on the gate insulator on a center portion of the superconducting channel.

16. A method as claimed in claim 15, wherein the oxide superconductor is a high-$T_c$ oxide superconductor.

17. A method as claimed in claim 16, wherein the high-$T_c$ oxide superconductor is a high-$T_c$ copper oxide-type compound oxide superconductor.

18. A method as claimed in claim 15, wherein the non-superconducting oxide layer is formed of $Pr_1Ba_2Cu_3O_{7-\epsilon}$ thin film.

19. A method as claimed in claim 15, wherein the oxide superconductor is formed of oxide superconductor material selected from the group consisting of Y-BA-Cu-O compound oxide superconductor material, a Bi-Sr-Ca-Cu-O compound oxide superconductor material and a T1-Ba-Ca-Cu-O compound oxide superconductor material.

20. A method as claimed in claim 15, wherein the substrate is formed of a material selected from the group consisting of MgO (100) substrate, a $SrTiO_3$ (100) substrate and a $CdNdAlO_4$ (001) substrate and a semiconductor substrate.

21. A method as claimed in claim 15, wherein the substrate is formed of a silicon substrate and a principal surface of the silicon substrate is coated with an insulating material layer which is formed of a $MgAlO_4$ layer and a $BaTiO_3$ layer.

\* \* \* \* \*